United States Patent [19]
Godart et al.

[11] 4,445,097
[45] Apr. 24, 1984

[54] MICROSTRIP TRANSISTOR OSCILLATOR WITH DIELECTRIC RESONATOR STABILIZATION

[75] Inventors: Jean-Jacques Godart; Bernard Le Clerc, both of Paris, France

[73] Assignee: Thomson-CSF, Paris, France

[21] Appl. No.: 302,123

[22] Filed: Sep. 14, 1981

[30] Foreign Application Priority Data

Sep. 16, 1980 [FR] France .................. 80 19917

[51] Int. Cl.$^3$ .............................. H03B 7/14
[52] U.S. Cl. .................. 331/117 D; 331/96; 331/107 SL; 331/117 FE
[58] Field of Search ............ 331/96, 107 DP, 107 SL, 331/117 D, 117 FE

[56] References Cited

U.S. PATENT DOCUMENTS 4,149,127  4/1979  Murakami et al. ............ 331/117 D

FOREIGN PATENT DOCUMENTS 56-47107  4/1981  Japan ..................................... 331/96

OTHER PUBLICATIONS

Wade, P. C., "Novel F.E.T. Power Oscillator" Electronics Letters, v. 14, n. 20, pp. 672–674, Sep. 28, 1978.
Podcameni, A. et al., "Stabilized FET Oscillator with Input Dielectric Resonator: Large Signal Design", Electronics Letters, v. 17, n. 1, pp. 44–45, Jan. 8, 1981.
IEEE Transactions on Microwave Theory and Techniques, vol. MTT28, No. 8, Aug. 1980, New York; O. Ishihara et al.: "A Highly Stabilized GaAs FET Oscillator using a Dielectric Resonator Feedback Circuit in 9–14 GH$_z$", pp. 817–824.
1979 IEEE MTT-S International Microwave Symposium Digest, 1979 New York; T. Saito et al.: "A 6 GH$_z$ Highly Stabilized GaAs FET Oscillator using a Dielectric Resonator", pp. 197–199.
IEEE Transactions on Microwave Theory and Techniques, vol. MTT27, No. 12, Dec. 1979, New York, G. D. Alley et al.: "An Ultra Low Noise Microwave Snythesizer", pp. 969–974.

*Primary Examiner*—Stanley D. Miller
*Assistant Examiner*—W. R. Paxman
*Attorney, Agent, or Firm*—Oblon, Fisher, Spivak, McClelland & Maier

[57] ABSTRACT

A device using a dielectric resonator with a very low temperature coefficient in a very high frequency transistor oscillator (3 to 10 GHz) so as to benefit both from the very high power available and the maximum frequency stabilization due to the resonator. In the case of a FET, the gate is connected to one end of a line coupled to a dielectric resonator at a point along the line situated at a quarter wavelength from the other end of the line, which in turn is connected through a discrete resistor to a half wavelength open circuit line. Thus, the oscillation is damped when the frequency varies from the resonant frequency of the resonator.

6 Claims, 4 Drawing Figures

MICROSTRIP TRANSISTOR OSCILLATOR WITH DIELECTRIC RESONATOR STABILIZATION

BACKGROUND OF THE INVENTION

The invention relates to a very high frequency transistor oscillators (above 1 GHz).

Gunn diode oscillators are known which function in the 3 to 10 GHz band with a very high stability obtained through the use of a dielectric oscillator with a very low temperature coefficient coupled to the Gunn diode. However, their power is limited to a few dozen milliwatts.

In addition, transistor oscillators functioning in the same frequency band are known, which have approximately the same stability obtained through the use of the same type of resonator. Their power can reach and even exceed 1 watt. However, at high frequency, their noise level is much higher than in the case of Gunn diode oscillators.

BRIEF SUMMARY OF THE INVENTION

The invention aims at reducing this disadvantage while utilizing the high power level of the latter type of oscillator, which may either comprise a field effect transistor or a bipolar transistor.

The oscillator according to the invention, of the type designed to operate at a predetermined frequency, comprises an active member whose gate, in the case of a field effect transistor or whose base, in the case of a bipolar transistor, is connected to a microstrip line of given characteristic impedance and of electric length at least equal to quarter the wavelength coupled in the vicinity of a predetermined point on said line to a dielectric resonator tuned to the said frequency, the end of said line on the side opposite to the transistor being connected via an ohmic resistance equal to the modulus of the characteristic impedance of the line to a resonant circuit providing an infinite reactive impedance on the point of insertion of said resistance at said frequency.

This resonant circuit may, for example, be constituted by a half wave line (at the considered frequency) in open circuit.

BRIEF DESCRIPTION OF THE DRAWINGS

The invention is described in greater detail hereinafter relative to non-limitative embodiments and with reference to the attached drawings, wherein show.

DETAILED DESCRIPTION OF THE PREFERRED EMBODIMENTS

Figure 1:
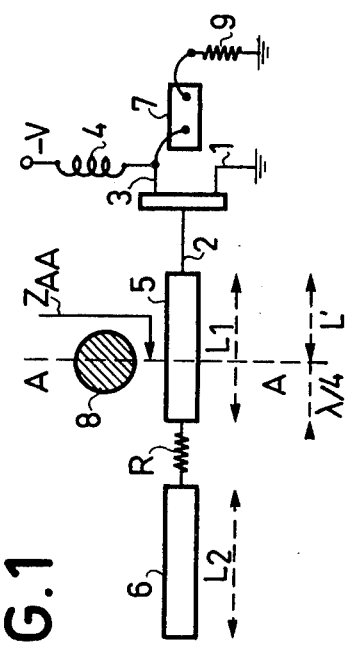
FIG. 1 is a circuit diagram of an oscillator according to the invention.

FIG. 1 diagrammatically shows an oscillator equipped with a transistor, which may either be a field effect transistor or a bipolar transistor. This transistor may either be a single chip or be placed in a box or case. In the drawing, 1 is one electrode of this transistor which is at the ground of the oscillator. As applicable, it may be the source of a field effect transistor, the collector of an npn bipolar transistor or the emitter of a pnp bipolar transistor. As appropriate, the transistor electrode 2 is the gate or base and electrode 3 is the third electrode of the transistor.

In FIG. 1, the transistor is supplied across an inductance 4 by a d.c. voltage $-V$. Such a voltage is negative in the case of a normal high frequency field effect transistor (n type channel). This circuit is said to be of the type wherein the transistor is mounted in a reverse manner: i.e. the voltages of source and drain are reversed. Such an arrangement permits a larger capacity between gate 2 and electrode 3, which makes it easier to function as an oscillator.

Moreover, electrode 2 is connected to one end of a conductor 5 constituting a first element of the microstrip line of length $L_1$ and which is connected through a discrete resistor R to a conductor 6 of lenght $L_2$, constituting a second element of the microstrip line.

A dielectric resonator 8 is positioned in the vicinity of element 5. It is constituted by a cylinder 8 (cylindrical stump) made from a ceramic material with a high relative dielectric constant (35 to 40) with low losses and a low expansion coefficient as a function of temperature and of general formula: $Zr_xSn_{1-x}TiO_4$ in which x is between 0.2 and 0.4.

A diametral plane of cylinder 8 perpendicular to element 5 and of line AA on the drawing plane subdivides element 5 into two parts of length, $L'$ on the side of the transistor, the other part being equal to a quarter wavelength of the frequency propagating in the microstrip line dielectric.

Finally, a third microstrip line element 7 is connected to the third electrode by one of its ends, the other end being connected to ground through the oscillator load, represented by an ohmic resistance line.

The following actions are taken to obtain very stable operation at frequency F with a minimum noise level around said frequency:

(1) Cylinder 8 in the aforementioned material is dimensioned in such a way that it resonates at frequency F, e.g. diameter 7.8 mm, height 3.9 mm in the case of F=8 GHz.

(2) Microstrip line element 6 is constructed to have a length $L_2$:

$$L_2 = \lambda/2$$

the wavelength $\lambda$ corresponding to frequency F propagating in the microstrip line dielectric.

(3) $Z_{AA}$ is taken as the impedance (at AA on the side opposite to the transistor) of the circuit comprising line 6, resistor R and the quarter wave section of line 5 coupled to resonator 8.

If $Z_O$ designates the characteristic impedance of line 5 and $\beta$ the coupling coefficient of resonator 8 to the line, we obtain:

$$Z_{AA} = \beta Z_O$$

at resonant frequency F of resonator 8. It substantially corresponds to an open circuit for a high coupling coefficient. However, on moving away from resonance, $Z_{AA}$ substantially corresponds to a short-circuit, due to the high overvoltage factor of the resonator.

On the basis of S parameters of the transistor, length $L'$ is regulated in such a way that the reflection coefficient ($S'_{22}$) calculated at the transistor output, an electrode 3, is a maximum the transistor input 2 being charged by an open circuit line of length $L'$.

(4) The distance being resonator 8 and line 5 is adjusted, i.e. the coupling coefficient in such a way that the negative resistance of the transistor output 3 is higher in absolute value than the real part of charge 9 across the transformation line 7.

(5) The presence of resistor R, charged by the half wave line 6 makes it possible to damp the oscillator outside the oscillation frequency, which leads to a very significant reduction in the so-called "frequency" noise.

Figure 2:
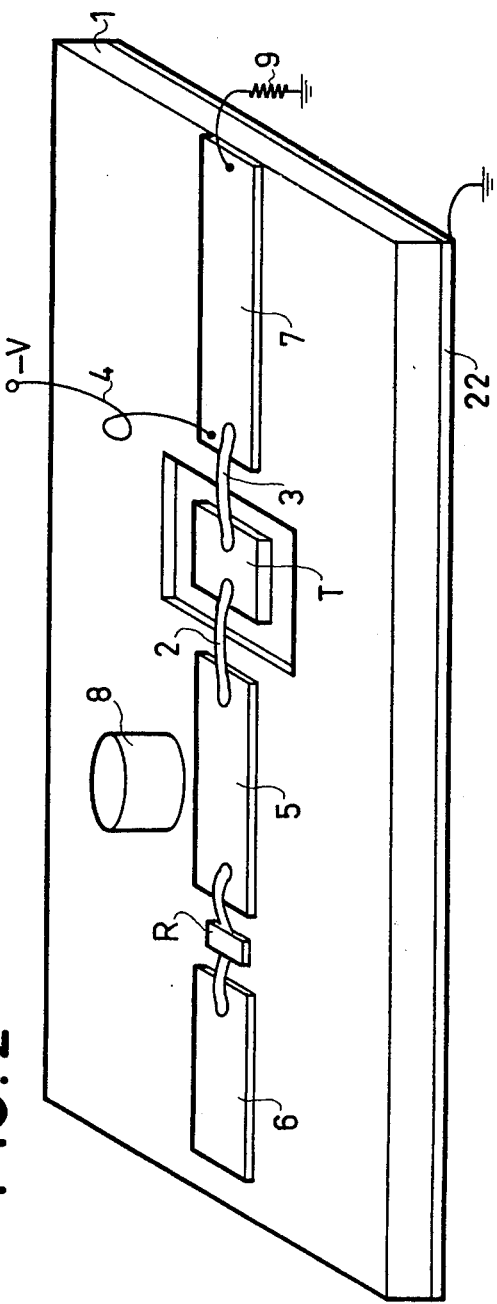
FIG. 2 in perspective, that part of the oscillator on a microstrip line.

In FIG. 2, where the same references designate the same or similar members, a construction according to the invention is shown. A silica substrate 21 in the form of a rectangular parallelepiped with two large rectangular, planar faces with a very elongated shape and a substrate thickness of 0.5 to 0.8 mm. The lower face is coated with a metallic coating 22 constituting a ground plane. Conductive strips or deposits 5, 6 and 7, representing the microstrip line elements of FIG. 1 are deposited on the upper face. Their width is so calculated so as to give the line a characteristic impedance of 50 ohms (1 to 1.7 mm in the present example). Moreover, the substrate has an opening 23 made in the substrate and this uncovers the ground plane and may be partly filled by a copper deposit, where a transistor T, whose electrode 1 (not shown) is soldered to ground. Resistor R is, for example, a rectangular parallelepiped made from appropriately doped silicon so as to give a value of 50 ohms between the connecting points of said resistor.

Figure 3:
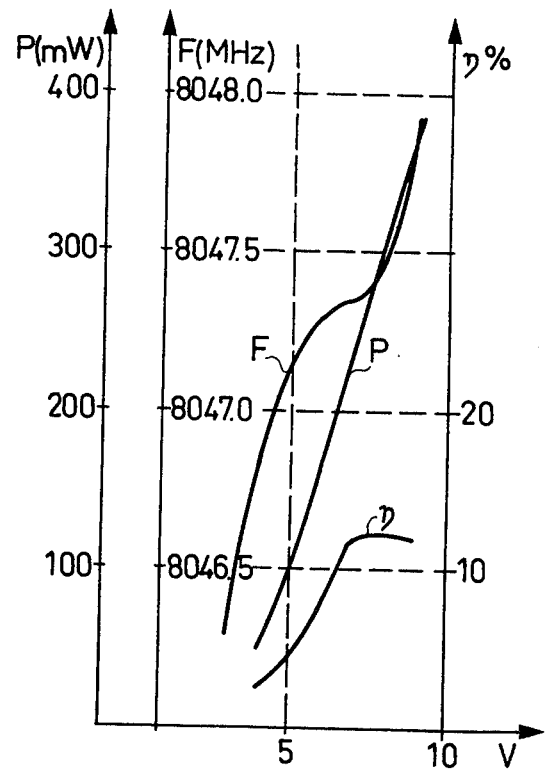
FIGS. 3 and 4 explanatory diagrams.

FIG. 3 gives an example of the results obtained with a field effect transistor, whose trade designation is MSC 88004 for which the optimum length L' is 0.236λ.

On the abscissa is plotted the voltage V in volts and on the ordinates in accordance with three different scales the power P in mW, the frequency F in kHz and the efficiency η in %. The high frequency power P is approximately 400 mW for V=9 volts.

Despite appearances, the frequency varies very little, due to a very wide scale, when V varies from 3 to 9 volts. At approximately 7 volts, the oscillation frequency variation coefficient is 50 kHz/volt. The maximum efficiency occurs between 7 and 9 volts.

Figure 4:
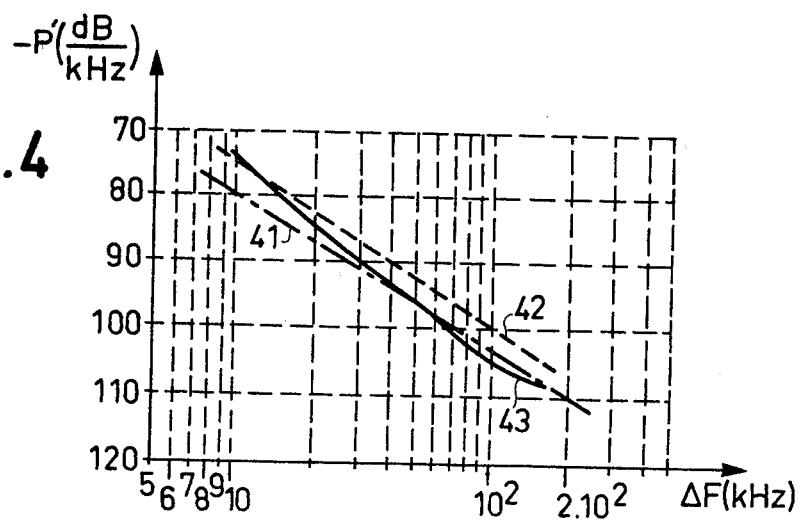

FIG. 4 gives the noise level −P' expressed in dB/kHz in reverse scale as a function of the band width in kHz (F) for three oscillators:
 an oscillator according to the invention (curve 41) with F=8 GHz and P=200 mW;
 an identical oscillator (curve 42) with F=8 GHz, but P=400 mW;
 a Gunn diode oscillator (curve 43) with F=9 GHz and P=20 mW.

It can be seen that the noise is approximately the same in the case of the invention as in the case of a Gunn diode oscillator, but the power is 10 to 20 times higher in the case of the invention.

What is claimed is:

1. A field effect transistor oscillator designed to operate at a predetermined frequency, comprising a field effect transistor whose gate is connected to a first microstrip line of given characteristic impedance and of length at least equal to one quarter wavelength of said frequency, said first line being coupled in the vicinity of a predetermined point along said first line to a dielectric resonator tuned to said frequency, the end of said first line opposite to the transistor being connected via an ohmic resistance equal to the characteristic impedance of said first line to a resonant circuit comprising a second microstrip line providing an infinite reactive impedance at said frequency when viewed from said resistance, the drain and source of said field effect transistor being decoupled from the resonator.

2. A bipolar transistor oscillator designed to operate at a predetermined frequency, comprising a bipolar transistor whose base is connected to a first microstrip line of given characteristic impedance and of length at least equal to one quarter wavelength of said frequency, said first line being coupled in the vicinity of a predetermined point along said first line to a dielectric resonator tuned to said frequency, the end of said first line located opposite to the transistor being connected via an ohmic resistance equal to the characteristic impedance of said first line to a resonant circuit comprising a second microstrip circuit providing an infinite reactive impedance at said frequency when viewed from said resistance, the emitter and collector of said transistor being decoupled from the resonator.

3. An oscillator according to claims 1 or 2, wherein the resonant circuit is a one half wave length line at said frequency and terminated as an open circuit.

4. An oscillator according to claims 1 or 2, wherein the resonator is made from a ceramic material of formula:

$$Zr_xSn_{1-x}TiO_4$$

in which x is between 0.2 and 0.4.

5. An oscillator according to claims 1 or 2, wherein the microstrip lines are produced on a silica substrate.

6. An oscillator according to claims 1 or 2, wherein the length of the first microstrip line is determined so as to bring about a maximum impedance when viewed from the side opposite the transistor at the point closest to the resonator.

* * * * *